United States Patent [19]

Ashar et al.

[11] 3,717,515

[45] Feb. 20, 1973

[54] PROCESS FOR FABRICATING A PEDESTAL TRANSISTOR

[75] Inventors: Kanu G. Ashar, Wappingers Falls, N.Y.; Leo W. Maheux, Underhill, Vt.

[73] Assignee: International Business Machines Corporation, Armonk, N.Y.

[22] Filed: Nov. 10, 1969

[21] Appl. No.: 875,016

[52] U.S. Cl. ......................148/175, 29/578, 29/580, 117/201, 117/212, 148/187, 317/235 R

[51] Int. Cl. ............................H01l 7/36, H01l 19/00

[58] Field of Search.......148/1.5, 174, 175, 186, 187; 117/201, 212; 317/234, 235; 29/578, 580; 156/17

[56] References Cited

UNITED STATES PATENTS

| | | | |
|---|---|---|---|
| 3,220,896 | 11/1965 | Miller | 148/175 X |
| 3,530,343 | 9/1970 | Irie et al. | 148/186 X |
| 3,244,950 | 4/1966 | Ferguson | 317/235 |
| 3,260,902 | 7/1966 | Porter | 317/235 |
| 3,312,881 | 4/1967 | Yu | 317/235 |
| 3,492,174 | 1/1970 | Nakamura et al. | 148/187 X |
| 3,534,234 | 10/1970 | Clevenger | 317/235 |
| 3,550,292 | 12/1970 | Irie et al. | 29/578 X |
| 3,585,464 | 6/1971 | Castrucci et al | 317/235 |

*Primary Examiner*—L. Dewayne Rutledge
*Assistant Examiner*—W. G. Saba
*Attorney*—Hanifin and Jancin and Kenneth R. Stevens

[57] ABSTRACT

This invention relates to a process for fabricating monolithic integrated circuits including at least one pedestal transistor device and comprises the steps of selectively forming and removing oxide layers to produce a substrate having a raised pedestal structure, diffusing a high conductivity impurity into the substrate so as to form a subcollector region having a pedestal portion, growing and then forming a flat epitaxial collector region over said subcollector region, using oxide conversion to remove the raised region, and successively diffusing a base and emitter region over the pedestal region.

2 Claims, 12 Drawing Figures

PRIOR ART

INVENTOR
KANU G. ASHAR
LEO W. MAHEUX

BY Kenneth R. Stevens
ATTORNEY

PROCESS FOR FABRICATING A PEDESTAL TRANSISTOR

BACKGROUND OF THE INVENTION

1. Field of the Invention

This invention relates to semiconductor devices and more particularly to a process for forming an integrated circuit pedestal transistor structure.

2. Brief Description of the Prior Art

In the formation of pedestal transistors in integrated circuits, it is of the utmost importance to obtain extremely high quality surfaces at the conclusion of each process step. As technology is directed towards smaller and smaller devices in order to reduce costs and provide higher speeds of operation, the uniformity of process control is even more significant. Accordingly, process steps which are tolerable for discrete devices and slower speed integrated circuits are not fully adaptable to process steps wherein device sizes are measured in angstroms. Of course, the ability to accurately control junction depths, epitaxial layer thicknesses, surface uniformity and quality enable monolithic integrated circuits to be built which have much smaller dimensions than was previously obtainable. The capability of working with small geometry devices increases device density and thus lowers cost, but requires capacity to handle high current densities. Degradation in device performance due to high current densities is well known. Device dimensions are extremely critical and directly related to the high frequency switching performance of a monolithic integrated circuit transistor device, sometimes characterized by $F_T$ which represents a figure of merit or power gain band-width for extremely high frequency operation.

It is known that to improve high frequency switching response using conventional transistors, it is required to compromise between reduced collector capacitance and collector resistance. Lighter doping in the collector region decreases capacitance at the expense of increased collector resistance.

A pedestal type collector structure, as described in U.S. Pat. No. 3,312,881, Yu, somewhat avoids this necessary compromise while further improving high frequency response. This prior art patent describes how to obtain thin base widths and minimal attendant base resistance increases by providing a relatively large base contact. In order that accompanying larger base-collector junction capacitance is not sacrificed at high frequency performance, an intrinsic (material) layer is extended from the extrinsic operational portion of the base-collector junction to the surface of the device. However, in order to obtain transistor operation in the extremely high frequency range, for example in gigahertz ($10^9$), numerous other design parameters need be considered which are related to the method of fabricating the device within extremely close tolerances.

It has been found that base transit time, an important factor of $F_T$ is directly proportional to the square of the base width, $W^2$, and is therefore quite sensitive to collector voltage variations. Moreover, dynamic base width widening is large as injected current density from the emitter causes a charge neutralization effect in the collector region next to the base-collector junction. This phenomena, sometimes referred to as the "Kirk" effect, occurs when the emitter current density becomes comparable to the collector bulk doping and results in the collector junction being electrically pushed deeper into the bulk collector region. Accordingly, base width time delay is particularly sensitive when the base widening factor is large. Also, the base widening phenomena or "Kirk" effect imposes a restriction on the achievement of smaller device geometries or dimensions. Normally, smaller dimensions are coupled with increased current density flow so as to further increase the problem of base widening. Thus, a compromise is required between small dimensions and the effects of the base widening phenomena.

In the past, collector depletion transit time is minimized by maintaining depletion layer thickness, $X_m$, at a small value. Lowering the resistivity on that side of the collector junction into which most of the depletion layer extends, will aid in accomplishing this desired result. Of course, the depletion layer thickness, $X_m$, and its influence on high frequency performance, is related to $V_{sc}$, the scattering limited velocity of the carriers.

Furthermore, it is known that excess phase is directly dependent upon the magnitude of the built-in field in the base region. The cutoff frequency for the base transport factor is theoretically at a 45° phase angle. Empirically, this angle is greater and has been measured at an excess phase of more than 12° over the 45° value for graded base transistors. This excess phase is dependent upon the steepness of the base impurity gradient, $N'_B/N_{BC}$, where $N'_B$ is the base impurity concentration under the emitter junction and $N_{BC}$ is the background impurity concentration in the collector region. As a result of this occurrence, the high frequency performance of a grounded emitter type transistor is associated with a phase correction constant, K . The K value may be optimized towards K = 1 by producing a retarding field in the base region.

Another factor which is related to the base transit time is the hole diffusion constant in the base or graded base regions. Quite significantly, the effect of collector and emitter resistances and their respective transition capacitances exercise control over the high frequency performance. As previously mentioned, the base width W is a significant factor in high frequency operation and it is to be realized that for a graded base structure the base sheet resistance, $R_{BB}$, is related to $\rho$ /W, where $\rho$ is resistivity in ohm-centimeter. Also, the $R_{BB}$ value for high frequency performance is significant and must take into account the $N'_B$ / $N_{BC}$ ratio, $N'_B$, W, and the electron mobility in the base, $\mu_{nb}$.

Accordingly, improved processes for optimizing these numerous design parameters are necessary in order to obtain high frequency performance in the resulting monolithic integrated circuit devices. The latitude and tolerance variations which were permissible with discrete transistor devices or even with monolithic are no longer endurable.

SUMMARY OF THE INVENTION

It is therefore, an object of the present invention to fabricate an integrated circuit pedestal transistor by a process which results in the formation of transistor devices having smaller dimensions than previously attainable without sacrificing high frequency switching performance.

It is another object of the present invention to provide an improved process for manufacturing integrated circuit pedestal transistors suitably adapted for monolithic form which eliminates restrictions for achieving smaller dimensions while eliminating undesirable base widening and base-collector capacitance problems.

In accordance with the aforementioned objects, the present invention provides a process for fabricating a monolithic integrated circuit including at least one pedestal transistor device using a single epitaxial grown layer and which includes the steps of providing a substrate of a first type conductivity and forming a pedestal region on said substrate by converting selected regions of the original substrate to an oxide and then removing the oxide. Then, a diffused pedestal subcollector region is formed over the pedestal region in the original substrate. A flat epitaxial layer is formed over the pedestal subcollector region so as to provide another collector region having a lower impurity concentration level than that of the pedestal subcollector region. Thereafter, base and emitter regions are diffused in a location above the pedestal collector region.

The foregoing and other objects, features, and advantages of the invention will be apparent from the following more particular description of the embodiments of the invention, as illustrated in the accompanying drawings:

BRIEF DESCRIPTION OF THE PREFERRED EMBODIMENTS

Figure 1:
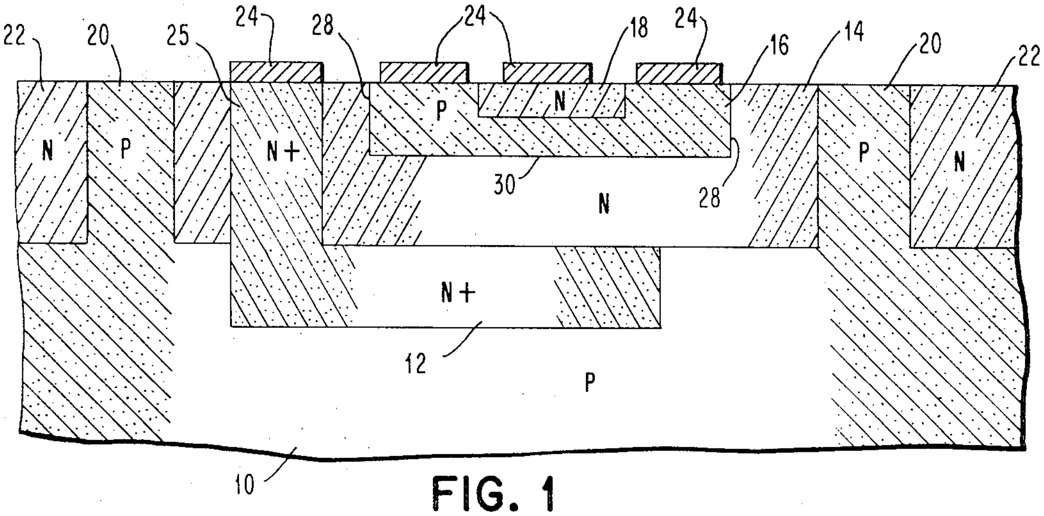
FIG. 1 is a cross-sectional view illustrating a partial section of a prior art monolithic integrated circuit transistor device employing a buried subcollector.

In FIG. 1, a conventional planar transistor fabricated in monolithic form is shown and illustrates a starting P type conductivity substrate upon which has been formed a buried subcollector transistor device and necessary isolation regions by known photoresist, diffusion, and epitaxial growth techniques. This portion of a monolithic integrated circuit comprises the P type conductivity substrate 10 upon which has been formed a transistor including a buried subcollector 12 and an N conductivity type epitaxial collector region 14, a P conductivity type base region 16, and an emitter diffused region 18. Conventional diffused isolation regions 20 provide electrical isolation between other devices, illustrated as 22, which are formed in the epitaxial layer 14. Aluminum metallization contacts, shown as 24, provide electrical contact to the different transistor regions, and an $N^+$ diffusion region 25 provides a suitable low resistivity reach-through to the $N^+$ subcollector region 12. Sometimes complete reach-throughs for $N^+$ subcollectors are not provided, but an emitter diffusion step is used to provide a low resistivity region for collector contacts.

The transistor device of FIG. 1 is limited as to its ultimate high frequency performance and as to the ultimate minimum geometry to which it may be fabricated. In the structure of FIG. 1, any attempt to decrease the base-collector capacitance at the sidewalls 28 and at the bottom wall junction 30 is confronted with the problem that a reduction in base-collector capacitance requires an increase in collector resistance. That is, decreasing the doping level in the collector region will decrease base-collector capacitance but will simultaneously increase collector resistance.

Moreover, as it becomes desirable to fabricate monolithic circuits at increasingly smaller dimensions, the base widening factor becomes a severe problem. As previously mentioned, the base widening factor is roughly dependent upon the current density injected from the emitter region into the collector region. As the emitter region and contacts become smaller, the current density naturally increases with an attendant undesirable increase in the base widening or "Kirk" phenomena.

Optimization of factors significant to high frequency operation, such as base width and the steepness of the base impurity gradient, $N'_B / N_{BC}$, the phase correction constant K , and other high frequency parameters must be sacrificed with respect to such things as the collector-emitter voltage, $V_{CE}$, and other known electrical specifications.

Figure 2:
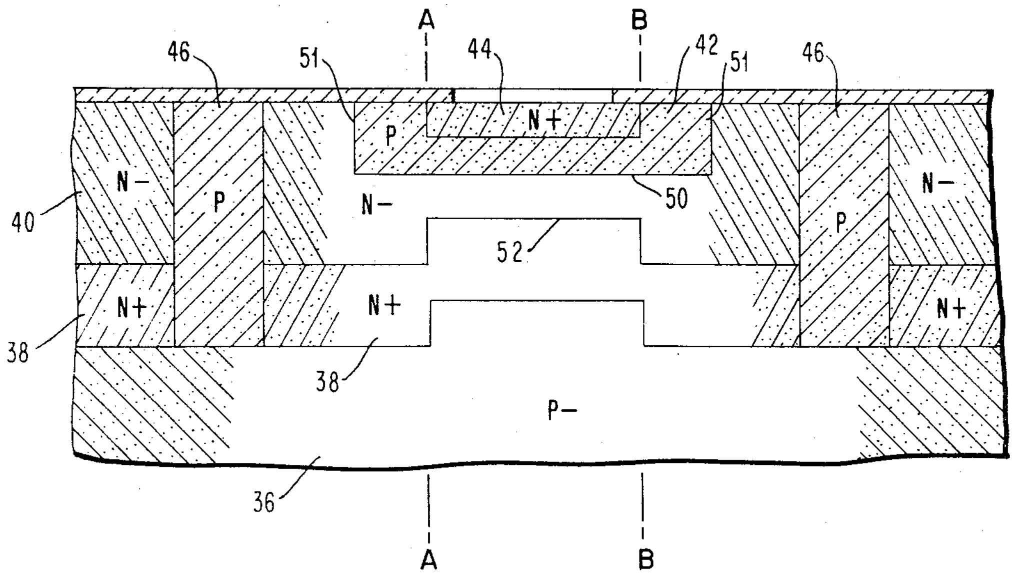
FIG. 2 is a cross-sectional view of a monolithic integrated circuit illustrating a pedestal transistor fabricated according to the process of the present invention.

The process of the present invention provides a pedestal transistor structure, FIG. 2, in monolithic integrated circuit form which is extremely advantageous in balancing the objectives of high frequency performance against conflicting restraints as to other electrical characteristics. The transistor device of FIG. 2, a preferred embodiment of the present invention, shows a pedestal transistor fabricated in monolithic form comprising a starting $P^-$ wafer pedestal region 36 upon which is formed a pedestal collector region 38 of $N^+$ conductivity type, and an epitaxial layer collector region 40 of $N^-$ conductivity type. A P type base region 42 and an $N^+$ emitter region 44 complete the pedestal transistor structure. A pair of P regions 46 on each side of the pedestal transistor are isolation diffusions which electrically isolate the transistor from other monolithic integrated circuit devices partially shown as $N^-$ and $N^+$ regions on each of the sides of the isolation regions 46.

In the transistor structure of FIG. 2, the region between lines A and B, and when extended running transversely through the device, is designated as the internal operational zone of the transistor. This region is where the useful transistor action occurs. The region outside of the lines A and B is designated as the extrinsic operational zone of the transistor device. The extrinsic operational zone serves no useful function insofar as the actual transistor action is concerned, but is necessary in order to allow such things as contact metallization to be made to the active regions of the transistor. Also, the structure of FIG. 2 is not drawn exactly to scale and, therefore, when considering overall base-to-collector capacitance, it is to be realized that the internal operational zone between lines A and B is of much shorter dimensions than actually is shown.

The structure of FIG. 2 is fabricated by the process of the present disclosure and results in an overall reduced collector-to-base capacitance. The overall collector-to-base capacitance includes the capacitance contributed by the horizontal base-to-collector junction 50 in the internal zone and the capacitance contributed by the bottom and side wall base-to-collector junctions 51 in the extrinsic operational region located on each side of the lines A and B. A lightly doped or $N^-$ impurity concentration exists in the extrinsic portion and contiguous therewith is the highly doped $N^+$ subcollector region 38. In contrast, the prior art structure illustrated in FIG. 1 contains only an N conductivity type in the collector region immediately adjacent the entire collector-to-base junction. As shown in FIG. 2, due to the lightly doped $N^-$ region 40 significant reduction in base-to-collector capacitance is obtained in the extrinsic zone. Generally, the lower the net doping level on the lighter doped side of a junction, then, lower capacitance is exhibited by that junction. In the internal zone, an $N^+$ material exists in the collector region at the base-collector junction. It is realized that this contribution increases collector-to-base capacitance per unit area because the depletion region is constrained in the narrower portion immediately above $N^+$ pedestal portion 52 and below the internal P base region. However, since the internal area is substantially smaller by an order of magnitude, an increase is more than offset by the decreased base-to-collector capacitance in the extrinsic operational region and thus the overall capacitance is significantly reduced.

Furthermore, the existence of the highly doped $N^+$ subcollector pedestal portion 52 greatly aids in minimizing or eliminating the undesirable base widening or "Kirk" effect phenomena. In the prior art structure of FIG. 1, as the injected current density from the emitter into the collector regions becomes comparable to the collector bulk doping, the collector junction is electrically pushed deeper into the collector region so as to effectively increase the base width and cause a corresponding decrease in high frequency performance, as for exampled measured by $F_T$. However, the increased $N^+$ doping level provided by the pedestal portion 52 allows the transistor to withstand a much higher emitter-current density. Thus, the geometries of the transistor devices in monolithic form may be significantly decreased (increased current densities) without incurring the base widening phenomena or degradation in high frequency performance.

Also, a single epitaxial layer technique allows for the attainment of close tolerance control in the fabrication of the actual base width, irrespective of the dynamic base widening phenomena. Double epitaxial techniques, as shown in a copending application to D. DeWitt filed Nov. 10, 1969, Ser. No. 875,013, assigned to the same assignee as the present application, or processes using mechanical steps in the fabrication of pedestal transistors result in tolerance variations, such as base width control electrical parameters values, resistivity, and concentration levels in the active transistor regions.

Figure 3:
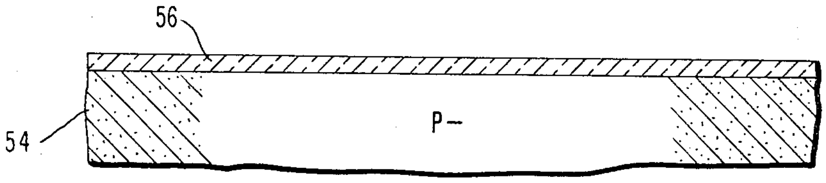
FIGS. 3 through 12 illustrate successive process steps employed in the fabrication of the pedestal transistor structure illustrated in FIG. 2, and shown in cross-section as a portion of a monolithic integrated circuit.
Figure 4:
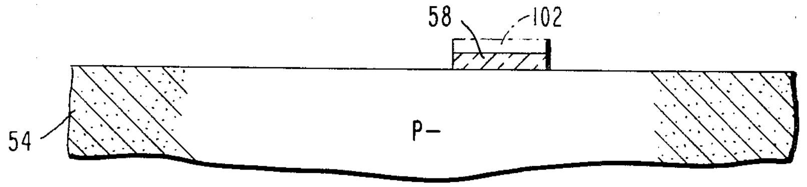
Figure 5:
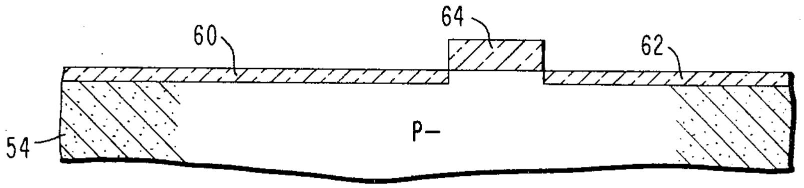
Figure 6:
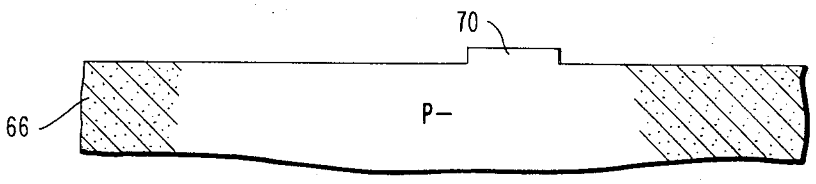

Now referring to FIGS. 3 through 13 which illustrate a process particularly suitable for small geometry and shallow junction devices and is compatible with planar integrated circuit technology, FIG. 3 shows a starting substrate $P^+$ wafer 54. A conventional thermal oxide layer 56 is grown over the starting wafer 54. Next, using known photolithographic techniques, a portion of the oxide layer is selectively etched away to leave a remaining pedestal oxide layer 58. As illustrated in FIG. 5, a thermal oxide layer is then grown. This additional thermal oxidation step converts the unexposed or unmasked silicon to a silicon oxide layers shown as 60 and 62. The silicon underneath the silicon oxide layer 58 is little affected by this additional thermal oxidation step. Thereafter, conventional etching techniques are employed to remove the oxides which comprise layers 60, 62, and the region 64 which is now somewhat thicker. The process steps illustrated in FIGS. 3 through 6 accurately form the starting substrate 66, now having a raised pedestal portion 70. This method of forming the pedestal region 70 is extremely desirable for the tolerances required by present day planar integrated circuits. A pedestal height of 5000 angstroms can be reliably formed with the process steps of FIGS. 3 through 6.

Figure 7:
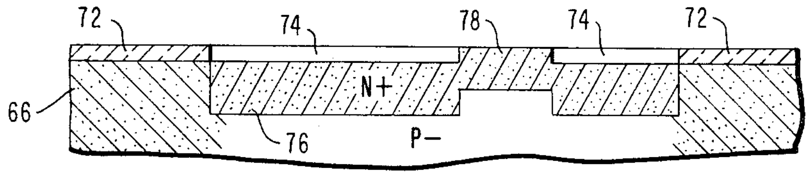
Figure 8:
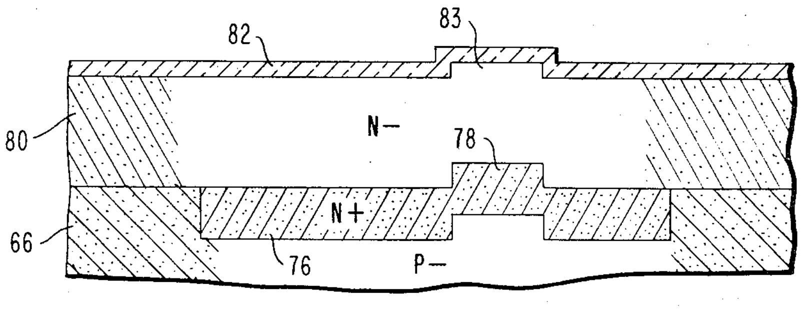
Figure 9:
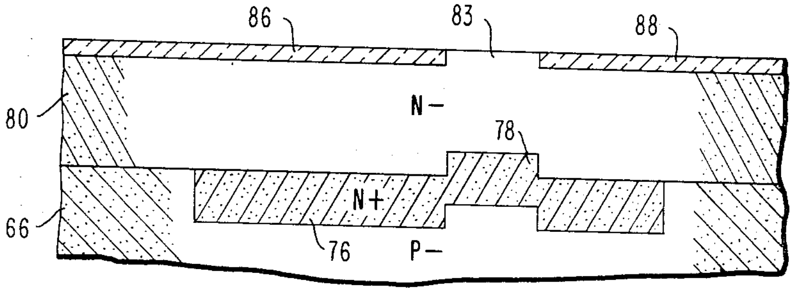
Figure 10:
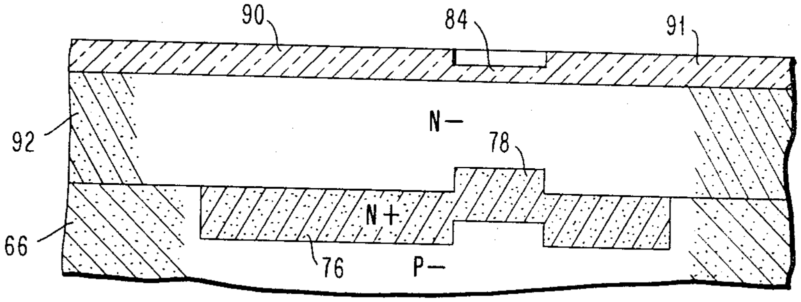
Figure 11:
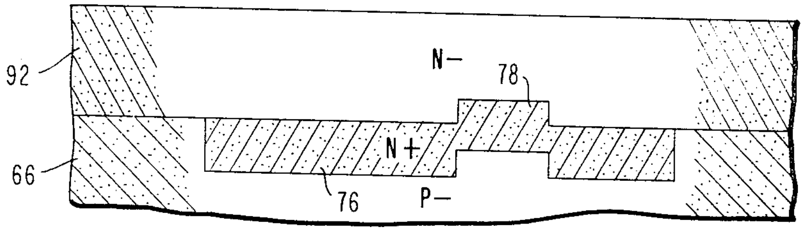
Figure 12:
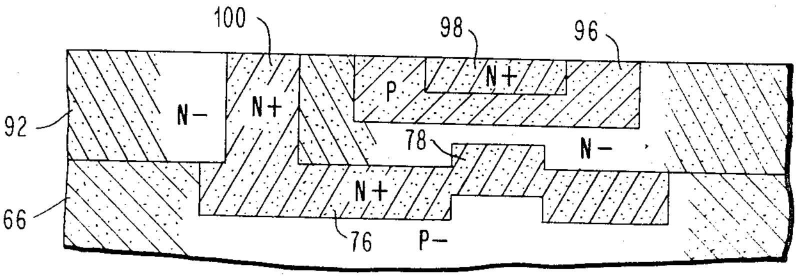

The remaining FIGS. 7 through 12 illustrate the formation of the transistor device. In FIG. 7, a suitable thermal oxide layer 72 is formed and then etched away to leave a diffusion opening 74. An $N^+$ type subcollector region 76 is then formed by a diffusion step into the opening 74 so as to convert a portion of the $P^-$ substrate to $N^+$ subcollector region 76. This diffusion step of FIG. 7 forms a highly concentrated $N^+$ raised or pedestal portion 78 which is necessary in the finished structure. Then, the oxide layer 72 is removed and, as shown in FIG. 8, an $N^-$epitaxial layer 80 is grown over the subcollector region 76. After the epitaxial deposition step, an oxide layer 82 is formed over epitaxial layer 80. The oxide over the newly formed raised $N^+$ pedestal portion 83 is then etched away by using a mask slightly larger than the emitter geometry. The resulting structure is shown in FIG. 9 and now comprises an unexposed $N^-$ pedestal region 83 and oxide layers 86 and 88 on each side. Next, as shown in FIG. 10, a thermal oxide etching or conversion operation is performed so as to convert the region 83 to silicon oxide. While silicon region 83 is being converted to a silicon oxide region 84, the previous oxide layers 86 and 88 are naturally built up more and are shown as 90 and 91 in FIG. 10. The oxide regions are now removed by conventional chemical etching. This leaves an accurately dimensioned flat epitaxial layer 92 having the desired surface qualities and electrical characteristics. The structure at this point is illustrated in FIG. 11. Finally, conventional base and emitter diffusions are formed in order to provide a P type base region 96 and an $N^+$ type emitter region 98. An $N^+$ type reach-through diffusion may be, if necessary, performed in order to provide a low resistivity region 100 to the subcollector region 76. The process steps as illustrated through FIG. 12 provide an extremely accurate pedestal transistor structure having desirable electrical characteristics. Also, it is to be understood that $N^-$, N, and $N^+$ refers to starting impurity concentrations in the range of $10^{15}$, $10^{17}$, and $10^{20}$, respectively.

The steps of FIGS. 3 through 12 provide an extremely accurate thermal oxidation etching process for forming a single epitaxial layer pedestal device. However, it is possible that for certain device materials long thermal oxidation cycles will be required and then it will be necessary to eliminate excessive outdiffusions from the device. Excessive outdiffusion can be reduced by minimizing the amount of time necessary to perform the thermal oxidation etching step illustrated in FIGS. 9 and 10. It has also been found that in some instances excessive exposure of a silicon surface to a thermal oxidation step will result in undesirable surface irregularities. Thus, minimal cycling time in the thermal oxidation etching steps illustrated in FIG. 5 is desirable as well as in the steps previously mentioned with respect to FIGS. 9 and 10.

This result is better understood by realizing the rate of forming the pedestal portion 70, e.g., in microns per second, is differentially determined by the rate which the unexposed silicon under layer 58 is not effected by a thermal oxidation step as against the rate which the exposed silicon, FIG. 4, is converted to a silicon oxide by a thermal oxidation step. Accordingly, in situations where these factors become significant, the use of a single oxide masking layer as previously shown in FIGS. 3 through 12 can be varied so as to include a masking layer combination comprising an oxide as well as other material, such as nitride.

As illustratively applied to FIG. 4, the masking layers would now constitute the original oxide portion 58 and an upper nitride layer 102, shown in phantom, so as to indicate its application as an alternative approach. Similarly, oxide-nitride-oxide layers may be employed in other situations.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method for fabricating a monolithic integrated circuit including at least one pedestal transistor device using a single epitaxial layer process comprising the steps of:

a. providing a substrate of a first conductivity type, b. forming a raised pedestal region on said substrate by forming an oxide layer and an overlying masking layer on said substrate in an area substantially conforming to said pedestal region, the masking layer being selected to limit thermal growth thereunder, and then converting selected non-pedestal regions of the original substrate to an oxide and then removing the oxide and masking layer, c. diffusing an impurity of a second conductivity type into a limited surface area larger than and encompassing said pedestal region, said second conductivity type being opposite to said first conductivity type, so as to convert a second region of the substrate to a second conductivity type, said second region constituting a pedestal subcollector region, d. growing and forming a substantially flat epitaxial layer over said pedestal region by removing a reproduced pedestal region formed on the upper surface of the epitaxial layer, removing said reproduced pedestal region formed on the upper surface of the epitaxial layer by converting said reproduced pedestal region to an oxide, and etching away said converted oxide, e. forming said substantially flat epitaxial layer of a material having a higher resistivity than said pedestal subcollector region, f. diffusing a base region into said epitaxial collector layer over said subcollector pedestal region, and g. diffusing an emitter region into said base region so as to define a base-emitter junction located substantially coextensive with the pedestal subcollector region.

2. A method for fabricating a monolithic integrated circuit including at least one pedestal transistor device using a single epitaxial layer process as in claim 1 further including the steps of:

a. providing a P type conductivity type starting substrate, b. diffusing an $N^+$ material impurity into said pedestal region for forming said pedestal subcollector region, c. growing and forming a substantially flat N type epitaxial layer over said subcollector pedestal region, d. diffusing a P type material impurity for forming said base region, and e. diffusing an N type material into said base region so as to form said emitter region.

* * * * *